United States Patent
Ueki et al.

(10) Patent No.: US 7,346,089 B2
(45) Date of Patent: Mar. 18, 2008

(54) SURFACE-EMITTING LASER DIODE WITH TUNNEL JUNCTION AND FABRICATION METHOD THEREOF

(75) Inventors: Nobuaki Ueki, Kanagawa (JP); Jun Sakurai, Kanagawa (JP); Hiromi Otoma, Kanagawa (JP); Masateru Yamamoto, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 190 days.

(21) Appl. No.: 11/259,096

(22) Filed: Oct. 27, 2005

(65) Prior Publication Data

US 2006/0227835 A1 Oct. 12, 2006

(30) Foreign Application Priority Data

Apr. 8, 2005 (JP) ............................. 2005-112406

(51) Int. Cl.
H01S 5/00 (2006.01)
(52) U.S. Cl. ................... 372/50.124; 372/45.012; 372/46.01; 372/46.013
(58) Field of Classification Search ............ 372/43.01, 372/44.01, 46.013, 50.124
See application file for complete search history.

(56) References Cited

U.S. PATENT DOCUMENTS

| | | | |
|---|---|---|---|
| 5,835,521 A | | 11/1998 | Ramdani et al. |
| 6,515,308 B1 * | | 2/2003 | Kneissl et al. ................. 257/86 |
| 6,653,158 B2 * | | 11/2003 | Hall et al. ...................... 438/22 |
| 6,687,281 B2 * | | 2/2004 | Coldren et al. ................ 372/96 |
| 6,810,065 B1 * | | 10/2004 | Naone .......................... 372/96 |
| 6,931,042 B2 * | | 8/2005 | Choquette et al. ........ 372/43.01 |
| 7,009,215 B2 * | | 3/2006 | D'Evelyn et al. .............. 257/98 |
| 7,123,638 B2 * | | 10/2006 | Leary et al. .............. 372/43.01 |
| 2002/0075926 A1 * | | 6/2002 | Coldren et al. ................ 372/46 |
| 2002/0127758 A1 * | | 9/2002 | Dagenais et al. ............. 438/46 |
| 2004/0218655 A1 * | | 11/2004 | Tandon et al. ................ 372/96 |
| 2005/0083979 A1 * | | 4/2005 | Leary et al. ................... 372/43 |

(Continued)

FOREIGN PATENT DOCUMENTS

JP A 10-303515 11/1998

(Continued)

OTHER PUBLICATIONS

Reddy et al., "Selectively Etched Tunnel Junction for Lateral Current and Optical Confinement in INP-Based Vertical Cavity Lasers," Journal of Electronic Materials, vol. 33, pp. 118-122 {2004}.

(Continued)

Primary Examiner—Minsun Oh Harvey
Assistant Examiner—Phillip Nguyen
(74) Attorney, Agent, or Firm—Oliff & Berridge, PLC.

(57) ABSTRACT

A surface emitting semiconductor laser diode of a tunnel junction type includes a semiconductor substrate, a first reflector, a second reflector, an active region disposed in series between the first and second reflectors, and a tunnel junction region disposed in series between the first and second reflectors. The tunnel junction region includes a first semiconductor layer of a first conductive type and a second semiconductor layer of a second conductive type that forms a junction with the first semiconductor layer, the first semiconductor layer being composed of a supper-lattice layer that at least partially includes aluminum and is partially oxidized.

14 Claims, 9 Drawing Sheets

U.S. PATENT DOCUMENTS

2005/0105576 A1* 5/2005 Kim .......................... 372/44
2006/0002444 A1* 1/2006 Wang et al. ................ 372/50.1
2006/0062266 A1* 3/2006 Jewell ..................... 372/43.01

FOREIGN PATENT DOCUMENTS

JP    A 10-321952    12/1998
JP    A 2002-134835    5/2002

OTHER PUBLICATIONS

Hall et al., "Increased Lateral Oxidation Rates of AlInAs on InP Using Short-Period Superlattices," Journal of Electronics Materials, vol. 33, pp. 118-122, {2004}.

* cited by examiner

GaAs SUBSTRATE

SURFACE-EMITTING LASER DIODE WITH TUNNEL JUNCTION AND FABRICATION METHOD THEREOF

BACKGROUND OF THE INVENTION

1. Field of the Invention

This invention relates to surface-emitting laser diodes with tunnel junctions and fabrication methods thereof, which are used for light sources of optical information processing or high-speed optical communication.

2. Description of the Related Art

In recent years, attention has been attracted to surface emitting laser diodes, in particular, to Vertical-Cavity Surface-Emitting Laser diodes (hereinafter, referred to as VCSEL) in the technical fields of the optical communication and optical storage.

VCSEL has excellent characteristics that are not provided by conventional edge-emitting laser diodes. For example, VCSEL have low threshold current and low power consumption. An optical spot is easily obtainable. The device can be tested at the wafer level. The structure can be integrated in a two-dimensional array configuration. Expectations for VCSEL having the afore-mentioned advantages are raised as a low-end light source in the communications field.

The optical communication with optical fibers has been used in mainly mid- and long-wavelength range data transfer (ranging from several kilometers to several tens kilometers) The conventional optical communication employs the single-mode optical fiber with silica as a material and the distributed feedback (DFB) laser having an oscillation peak in the long wavelength range at 1.31 µm or 1.55 µm. The laser in this long-wavelength range exhibits excellent characteristics of "lower dispersion and extremely smaller transmission loss". Nevertheless, the wavelength has to be controlled strictly. This demands temperature control of the device and causes a problem that downsizing is difficult. In addition, the production volume of the optical fibers is still small, as compared to the consumer products, largely because only telecommunications carriers are the users of the optical fibers. Therefore, the laser diodes are considered costly device elements.

These days, owing to a growing rate of the Internet access with asymmetric digital subscriber line (ADSL) or cable TV (CATV) at home, it is possible to transmit large-volume data as much as dozens of times, much larger than ever before. Along with the popularization of the Internet access, demands on the large-volume data transmission will be further increased. The optical fibers will definitely be available at home in the near future.

In the short-distance communication (ranging from several meters to several hundred meters), however, it is too expensive to use both the single-mode optical fiber and the DFB laser. It is considered economical to employ a combination of a costly optical fiber such as multimode silica fiber or plastic optical fiber (POF) together with a short-wavelength range (at 0.85 µm) that gives good performance when used with the afore-mentioned fibers. VCSEL is becoming widely used for the above-described applications.

In the mid- and long-distance communication, on the other hand, the single-mode optical fiber and the DFB laser are still used. However, the demands for cost reduction in the mid- and long-distance communication will apparently increase the demand for the lasers in the long-wavelength range (at 1.31 µm or 1.55 µm) exhibiting a superior cost performance. This is the reason VCSELs attract interests instead of the edge-emitting laser diodes, the yield of which is low.

In fact, VCSELs in the long-wavelength range have more problems than those in the short-wavelength range. Therefore, it is still impossible to replace the edge-emitting laser diodes.

There have been proposed structures of VCSEL in the long-wavelength range that exceeds 1 µm in the oscillation wavelength. One structure employs a GaInNAs-based material lattice matched to a GaAs substrate, and another structure is a hybrid structure that includes an InGaAsP-based material in lattice matched to an InP substrate and further includes either a semiconductor multi-film reflector or dielectric multi-film reflector of further another material.

When the VCSEL employs the GaInNAs-based material as disclosed in Japanese Patent Application Publication No. 10-303515, the GaInNAs-based material is used for a quantum well layer of active layer, whereas AlGaAs/GaAs-based material, which has proved the performance in the short-wavelength range, is used for the multi-film that forms a reflector, a spacer layer, a contact layer, or the like. Accordingly, VCSEL can be fabricated in a relatively small number of processes, that is, after the epitaxial growth is implemented on the GaAs substrate, the current funneling region and electrodes are formed thereon. In other words, it is convenient because the material used for the quantum well layer of the existent short-wavelength VCSEL is changed from GaAs to GaInNAs. Therefore, many studies and experiments have been made and this is the closest to practical use in the long-wavelength VCSELs.

On the other hand, when fabricating the long-wavelength laser diode in which the InGaAsP-based material is used for the quantum well layer, generally, the InP substrate is used to form the lattice matched to the afore-mentioned material. However, a multilayer has to be as thick as at least 50 periods in one of the reflectors to enhance the reflectance, when fabricating the VCSEL with the InGaAsP-based material. This is caused by the characteristics of the refractive index of the InGaAsP-based material, which does not largely change relative to the relative proportions, unlike the refractive index of the AlGaAs-based material. The film having a large number of periods increases the element resistance value and degrades the heat dissipation capacity. It is not desirable in view of the reliability. That is to say, it is considered difficult to fabricate the reflector almost completely reflective, namely, 99 percent at least, by epitaxially growing the InP substrate lattice matched, in the long-wavelength VCSEL having the InGaAsP-based material.

In order to address the afore-mentioned problem, in the hybrid structure with the InGaAsP-based material as disclosed in U.S. Pat. No. 5,835,521, the reflectors are separately fabricated from the neighboring region of the active region, and then are bonded together in a later process. This is called substrate fusion bonding. The substrate fusion bonding makes it possible to bond the semiconductor substrates that cannot form a lattice matched structure, enabling various applications.

In the hybrid structure, however, a discontinuous interface is created between the active region into which the current is injected and the reflectors. The discontinuous interface is low in distinctness as compared to the interface of crystal growth. The carriers that travel through the discontinuous interface are trapped to the level formed in the interface. In most cases, this results in the nonradiative recombination that the carriers are changed to thermal outputs. There are few cases where the reflectors are used for current injection.

Generally, another structure, known as intracavity type, is employed. This structure includes a current path that bypasses the reflectors. However, even in this case, the current funneling region is separately necessary. Accordingly, the techniques for the selective etch or tunnel junction are also utilized together.

Japanese Patent Application Publication No. 10-321952 and Japanese Patent Application Publication No. 2002-134835 disclose the VCSELs in which the tunnel junction region is arranged in series between top and bottom semiconductor Bragg reflectors. This eliminates the necessity of p-type semiconductor Bragg reflector having a high light absorption and high resistance. N-type semiconductor Bragg reflectors are used for top and bottom reflectors to reduce the threshold current or the like. U.S. Pat. No. 6,515,308B1 also discloses the structure in which the tunnel junction region is interposed between the top and bottom reflectors in the nitride-based VCSEL.

Additionally, M. H. M. Reddy et al., "Selectively Etched Tunnel Junction for Lateral Current and Optical Confinement in InP-Based Vertical Cavity Lasers," Journal of Electronic Materials, Vol. 33, Pages 118-122, 2004 discloses the long-wavelength VCSEL in which the selective etch and the tunnel junction are combined. In the InP-based VCSEL, the currents in the lateral direction and lights are confined by using the selective etch. E. Hall et al., "Increased Lateral Oxidation Rates of AlInAs on InP Using Short-Period Super lattices," Journal of Electronic Materials, Vol. 29, Pages 1100-1104, 2000 discloses the method for selectively oxidizing the super lattices and describes the oxidation rate in short-period super lattices of AlAs and InAs provided on InP.

It is to be noted that the structure having GaInNAs-based material, even if the material used for the quantum well active layer and the thickness thereof are controlled as much as possible, there is the problem in that it is difficult to increase the oscillation wavelength up to 1.31 μm, namely, zero dispersion of optical fiber, without sacrificing the reliability or electric or optical characteristics. Light absorption increases as the carrier concentration is increased in the p-type DBR layer, causing degradation in the luminous efficiency. There are drawbacks for practical use.

On the other hand, in the hybrid structure, the tunnel junction is electrically separated from the surrounding region to define the current injection region. On this account, the selective etch, selective oxidation, crystal regrowth, or the like are employed. Accordingly, the quality of this region decides the characteristics of the laser.

The selective etch, however, is not desirable in view of the reliability, with the exception of laboratory use, because the element partially has so-called voids. This is not desirable in view of reliability, except for experimental use. The selective oxidation has limitations in the material lattice matched to the InGaAsP-based material to be oxidized, namely, the material lattice matched to InP, For example, when InAlAs is used, thermal treatment is needed at high temperature for a long time and it is difficult for practical use. The buried structure with the crystal regrowth is most commonly used, yet in this technique, the element characteristics largely depend on the crystal performance of the uppermost surface, causing variations in the characteristics.

As described, there is no long-wavelength VCSEL that exhibits sufficient characteristics in the structure and fabrication method. Therefore, it is demanding the VCSEL that is excellent in mass production and easy in fabrication process.

SUMMARY OF THE INVENTION

The present invention has been made in view of the above circumstances and provides a long-wavelength VCSEL excellent in mass production and a fabrication method thereof without crystal regrowth or other complex processes.

According to one aspect of the present invention, there may be provided a surface emitting semiconductor laser diode of a tunnel junction type including a semiconductor substrate; a first reflector; a second reflector; an active region disposed in series between the first and second reflectors; and a tunnel junction region disposed in series between the first and second reflectors. The tunnel junction region may include a first semiconductor layer of a first conductive type and a second semiconductor layer of a second conductive type that forms a junction with the first semiconductor layer, the first semiconductor layer being composed of a supperlattice layer that at least partially includes aluminum and is partially oxidized.

According to another aspect of the present invention, there may be provided a module having the above-mentioned surface emitting semiconductor laser diode of a tunnel junction type.

According to a further aspect of the present invention, there may be provided an optical transmission apparatus that includes the above-mentioned module; and a transmission device that transmits a laser beam emitted from the module.

According to a further aspect of the present invention, there may be provided a free space optical transmission apparatus that includes the above-mentioned module; and a transmission device that transmits spatially a laser beam emitted from the module.

According to a further aspect of the present invention, there may be provided an optical transmission system that includes the above-mentioned module; and a transmission device that transmits a laser beam emitted from the module.

According to a further aspect of the present invention, there may be provided a free space optical transmission system that includes the above-mentioned module; and a transmission device that transmits spatially a laser beam emitted from the module.

According to a further aspect of the present invention, there may be provided a fabrication method of a surface emitting semiconductor laser diode of a tunnel junction type having a semiconductor substrate, a first reflector, a second reflector, an active region disposed in series between the first and second reflectors, and a tunnel junction region disposed in series between the first and second reflectors, the fabrication method including epitaxially growing the active region having a quantum well structure on the semiconductor substrate; and epitaxially growing the tunnel junction region having a supper-lattice layer.

According to a further aspect of the present invention, there may be provided a fabrication method of a surface emitting semiconductor laser diode of a tunnel junction type, the fabrication method including preparing a first semiconductor substrate on which a semiconductor layer having at least an active layer and a tunnel junction region are fabricated; preparing a second substrate on which at least a first multi-film reflector is fabricated; implementing a fusion bonding to bond the semiconductor layer on the first semiconductor substrate and the first multi-film reflector on the second substrate; removing the first substrate; and forming a second multi-film reflector on the semiconductor substrate.

BRIEF DESCRIPTION OF THE DRAWINGS

Embodiments of the present invention will be described in detail based on the following figures, wherein.

DESCRIPTION OF THE EMBODIMENTS

A description will now be given, with reference to the accompanying drawings, of embodiments of the present invention. On a surface-emitting laser diode in accordance with the embodiments of the present invention, a post structure may be formed on a semiconductor substrate, and a laser beam is emitted from a top of the post structure. In this specification, "mesa" is used as a synonym for "post" and "film" is used as a synonym for "layer".

EMBODIMENTS

Figure 1:
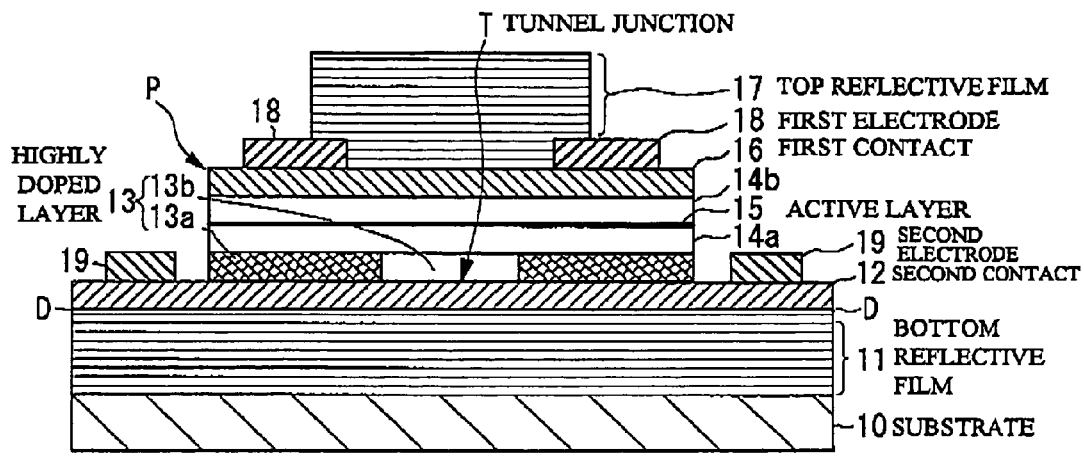
FIG. 1 is a sectional-view of a VCSEL in accordance with a first embodiment of the present invention.

FIG. 1 is a sectional-view of a VCSEL in accordance with a first embodiment of the present invention. Referring to FIG. 1, a VCSEL 1 in accordance with the first embodiment of the present invention includes a GaAS semiconductor substrate 10, On the semiconductor substrate 10, sequentially from the bottom of FIG. 1, there are provided an undoped bottom reflective film 11 composed of semiconductor multiple films of GaAs/AlGaAs, a second contact layer 12 with a n-type high impurity concentration, a highly doped layer 13 with a p-type high impurity concentration, a spacer layer 14a, an active region 15 arranged between two spacer layers, another spacer layer 14b, a first contact layer 16 with an n-type high impurity concentration, and a top reflective film 17 composed of dielectric multiple films of $TiO_2/SiO_2$. Each of the bottom reflective film 11 and the top reflective film 17 serve as a DBR (Distributed Bragg Reflector).

Ring-shaped first second electrodes 18 and 19 are respectively formed on the first and the second contact layers 16 and 12 to establish an electric contact and form an intracavity contact. Currents necessary for laser oscillation are supplied from the first second electrodes 18 and 19. The VCSEL 1 in accordance with the present embodiment is fabricated in the substrate fusion techniques, as will be described later in detail, such that the semiconductor layers deposited on two semiconductor substrates are bonded together. D in the drawings denotes a substrate fusion region, an interface of such bonded substrates.

In accordance with the present embodiment, a column-shaped post P is formed on the second contact layer 12 from the p-type highly doped layer 13 through the first contact layer 16. The highly doped layer 13 is at least partially is made of a short-period supper-lattice layer including aluminum. A selectively oxidized region 13a is provided in a periphery of the short-period supper-lattice layer including aluminum. An aperture 13b of conductive region remains in the center thereof without being oxidized, and defines a laser emitting region of the laser beam emitted from the active region 15 and also serves as a current funneling region. The current funneling region is a current confinement region.

At least one layer of the short-period super-lattice layer is made of a semiconductor layer that includes concentrated aluminum. Concentrated p-type impurities are wholly doped in the highly doped layer 13, and a tunnel junction T is created between the n-type second contact layer 12 adjacently arranged thereto.

Voltages are applied to the first electrode 18 negatively charged and the second electrode 19 positively charged, and then a tunneling current flows across the tunnel junction T. At this point, the tunneling current is confined in the lateral direction by the selectively oxidized region 13a, and accordingly electron-dense tunneling currents are injected into the active region 15.

Figure 2:
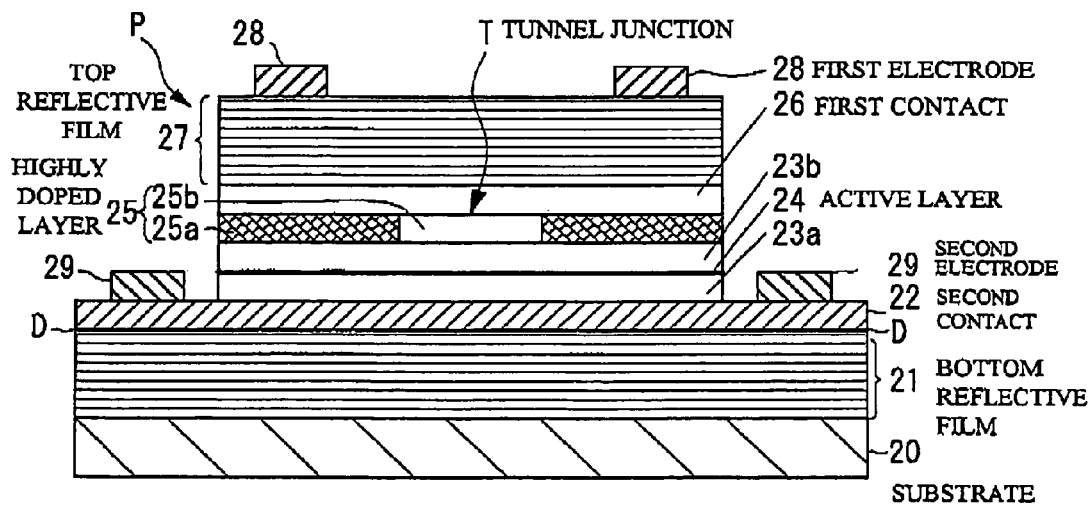
FIG. 2 is a cross-sectional view of the VCSEL in accordance with a second embodiment of the present invention.

FIG. 2 is a cross-sectional view of the VCSEL in accordance with a second embodiment of the present invention. A VCSEL 2 in accordance with the second embodiment includes a semiconductor substrate 20. On the semiconductor substrate 20, sequentially from the bottom of FIG. 2, there are provided an undoped bottom reflective film 21 composed of semiconductor multiple films of GaAs/AlGaAs, a second contact layer 22 with a n-type high impurity concentration, a spacer layer 23a, an active region 24 arranged between the spacer layers, another spacer layer 23b, a highly doped layer 25 with a p-type high impurity concentration, a first contact layer 26 with an n-type high impurity concentration, and a top reflective film 27 composed of a semiconductor multiple films of InP/InGaAsP. Each of the bottom reflective film 21 and the top reflective film 27 serves as the DBR.

The column-shaped post P is formed on the second contact layer 22 from the spacer layer 23a to the top reflective film 27. Ring-shaped first electrode 28 is provided on the top reflective film 27, namely, on a top of the post P. Ring-shaped second electrode 29 is provided on the second contact layer 22, namely, on a bottom of the post P. First and second electrodes 28 and 29 respectively establish electric contacts with the top reflective film 27 and the second contact layer 22. The VCSEL 2 in accordance with the second embodiment of the present invention uses the top reflective film 27 as an electric path, which is different from the VCSEL 1 in accordance with the first embodiment of the present invention.

The highly doped layer 25 is wholly composed of the short-period super-lattice layer, and two types of semiconductor films having different compositions are alternately deposited. However, one type of the semiconductor films is made of the material that includes concentrated aluminum.

A selectively oxidized region 25a is provided in a periphery of the short-period supper-lattice layer. An aperture 25b of conductive region remains in the center thereof without being oxidized. Concentrated p-type impurities are wholly doped in the highly doped layer 25, and then the tunnel junction T is formed between the n-type first contact layer 26 adjacently arranged thereto.

Voltages are applied to the first electrode 28 positively charged and the second electrode 29 negatively charged, and then the tunneling current flows across the tunnel junction T. At this point, the tunneling current is confined in the lateral direction by the oxidized region 25a in the highly doped layer 25, and electron-dense tunneling currents are injected into the active region 24.

A description will now be given of the VCSELs in accordance with the first and second embodiments of the present invention. In the following description the names of materials will be represented as chemical sign, atomic symbol, or chemical formula.

FIGS. 3A through 5C are cross-sectional views illustrating a configuration and fabrication processes of the VCSEL 1 in accordance with the first embodiment of the present invention. First, referring to FIG. 3A, with the use of the molecular beam epitaxy (MBE), on an undoped InP substrate 41, there are sequentially deposited the first contact layer 16 of n-type InP layer, the spacer layer 14b of undoped InGaAsP layer, the active layer 15 of undoped InGaAsP layer, the spacer layer 14a of undoped InGaAsP layer, the highly doped layer 13 of a laminated body, and the second contact layer 12 of $n^{++}$ InP layer. The laminated body of the highly doped layer 13 is made up with the short-period supper-lattice layer of p-type AlAs/InAs and a $p^{++}$ layer of $Al_{0.48}In_{0.52}As$. Here, it is configured that carrier density of the $p^{++}$ layer of $Al_{0.48}In_{0.52}As$ is $3\times10^{19}$ cm$^{-3}$, and that of the $n^{++}$ InP layer is also $3\times10^{19}$ cm$^{-3}$. Five period s of AlAs/InAs are deposited in the short-period supper-lattice layer.

Figure 3A:
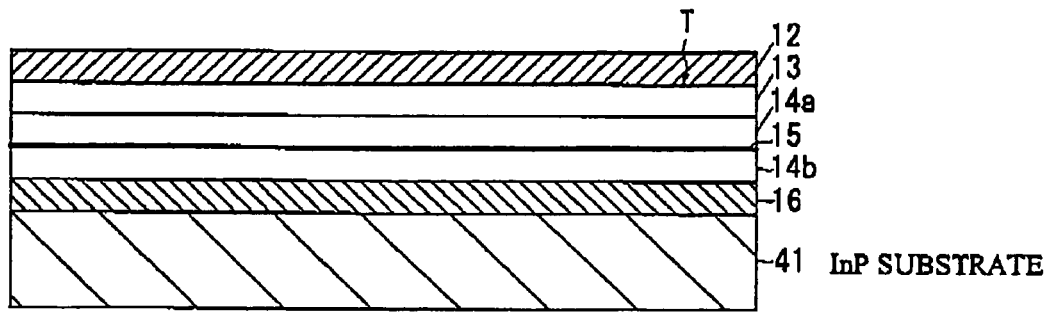
FIGS. 3A through 5C are cross-sectional views illustrating a configuration and fabrication processes of the VCSEL 1 in accordance with the first embodiment of the present invention.
Figure 3B:
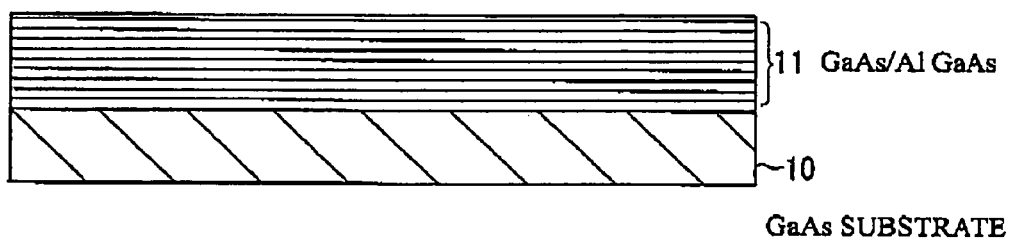

Next, referring to FIG. 3B, also with the MBE, on the substrate 10 of undoped GaAs, there is provided the semiconductor multiple films 11 of a laminated body having multiple layers, in which 35.5 periods of undoped GaAs layers and undoped $Al_{0.9}In_{0.1}As$ layers are deposited. Here, each layer included in the semiconductor multiple films (bottom reflector) 11 has a thickness of $\lambda/4n_r$ (where $\lambda$ denotes an oscillation wavelength and nr denotes an optical refractive index in the medium).

The active layer 15 is configured to include quantum well layers of undoped InGaAsP layer ($\lambda_g=1.31$ μm) and barrier layers of undoped InGaAsP layer ($\lambda_g=1.2$ μm), which are alternately deposited so that outer layers may be the barrier layers. The active layer 15 is interposed between the spacer layers 14a and 14b of undoped InGaAsP layer ($\lambda_g=1.1$ μm). The spacer layers 14a and 14b and the afore-mentioned quantum well layers and the barrier layers are configured to have the thickness of integral multiple of $\lambda/n_r$.

Figure 3C:
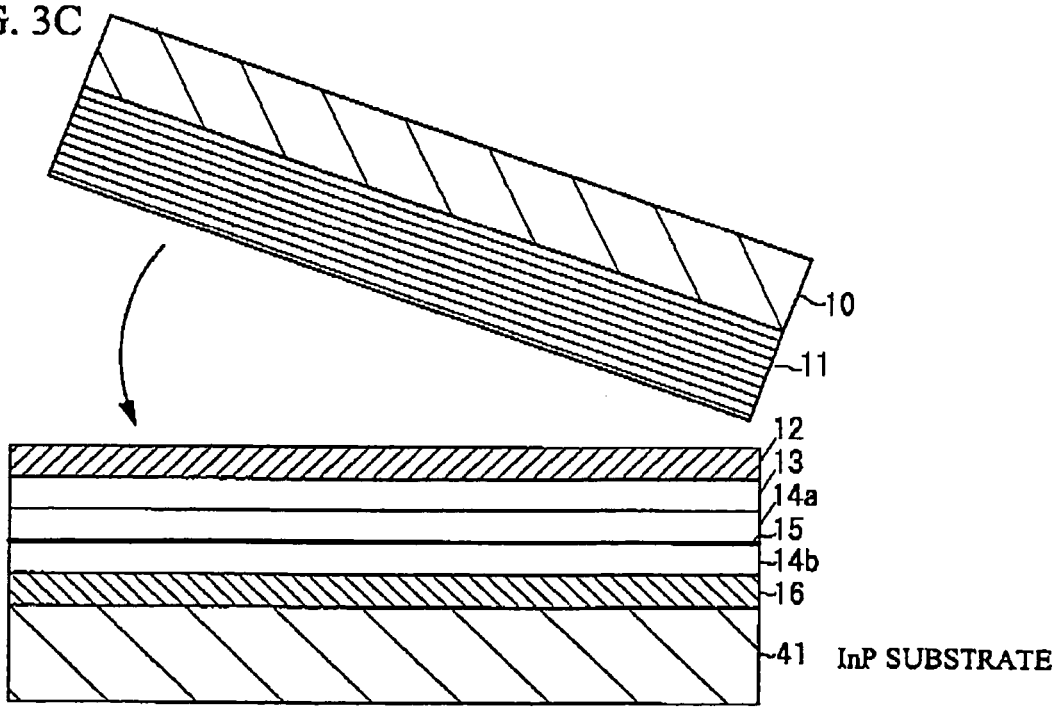
Figure 4A:
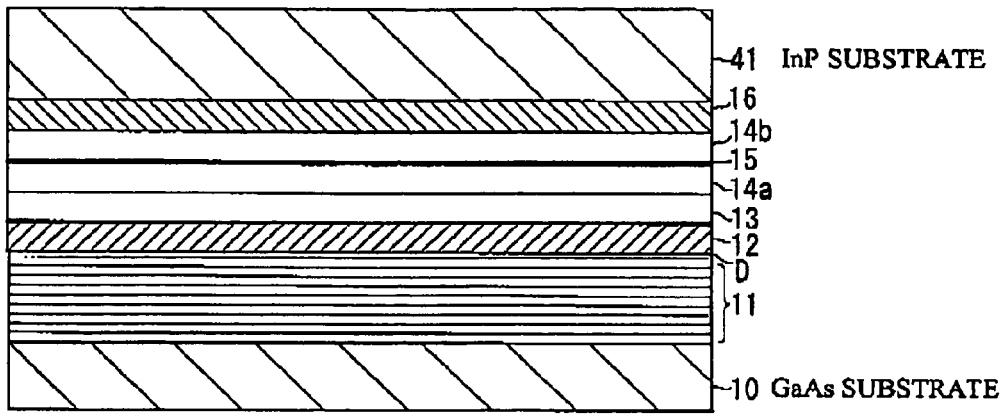

Referring now to FIG. 3C, the multiple films 12 through 16 already deposited on the InP substrate 41 is bonded with the multiple films 11 deposited on the undoped GaAs substrate 10, and then the thermal treatment is carried out at 600 to 650 degrees C for approximately one hour in hydrogen atmosphere. This thermally seals the second contact layer 12 and the semiconductor multiple films 11 in the interface D. Referring now to FIG. 4A, the VCSEL substrate is fabricated in the fusion bonding method to be sandwiched by the InP substrate 41 and the GaAS substrate 10.

Figure 4B:
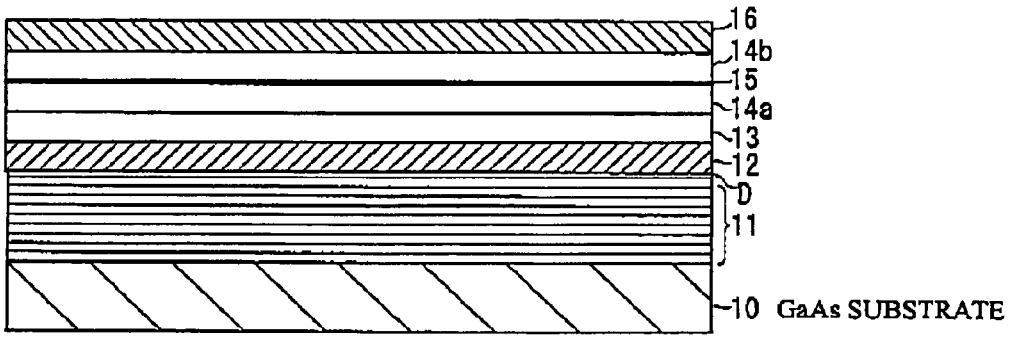

Referring to FIG. 4B, when the active layer 15 of InGaAsP is deposited, the InP substrate 41 used as a supporting substrate is etched and removed. It is possible to insert an extremely thin n-type InGaAsP layer used as an etch stop layer, between the undoped InP substrate 41 and the first contact layer 16 of InP layer.

Figure 4C:
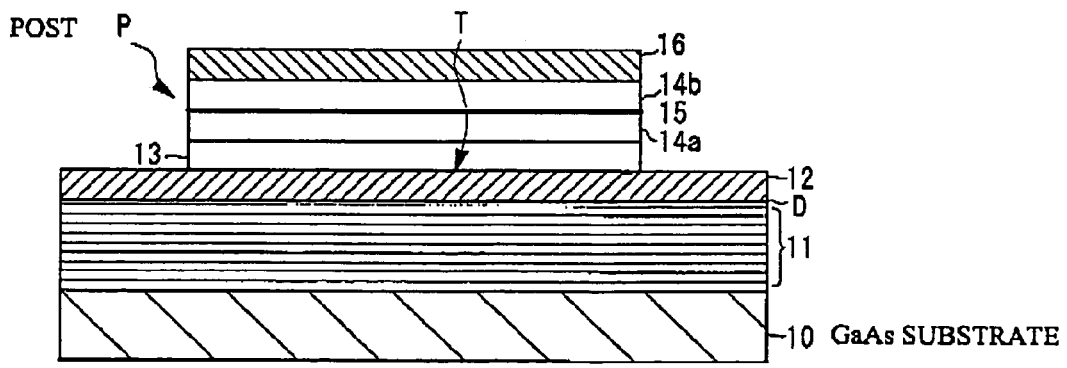

Now, referring to FIG. 4C, the first contact layer 16, the space layers 14a and 14b, the active layer 15, and the highly doped layer 13 are respectively selectively etched with the second contact layer 12 used as the etch stop layer, so as to have a shape of column (post) having a diameter of 50 μm. The etch stop layer uniquely defines the etch depth, and the short-period super-lattice layer of AlAs/InAs included in the highly doped layer 13 is exposed as a part of a side face of the post P.

Figure 5A:
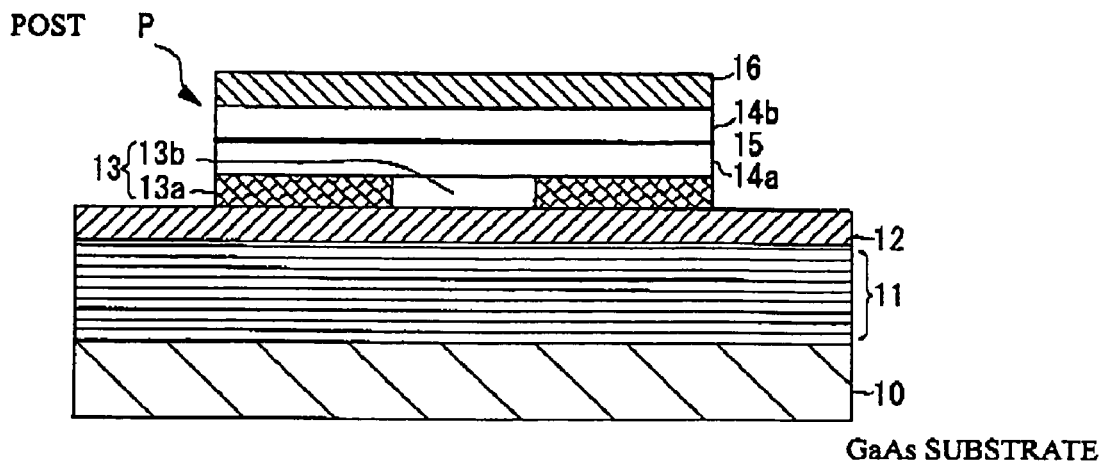

Subsequently, the laser substrate is exposed to water vapor atmosphere at 340 degrees C with a carrier gas of nitrogen (flow volume: 2 litters/minute) for 60 minutes. At this point, the AlAs layer included in the short-period supper-lattice layer has an oxidation rate much faster than other layers exposed to the side face of the post P. Therefore, as shown in FIG. 5A, a substantially circle-shaped nonoxidized region 13b, which reflects an outer shape of the post is formed immediately below the active layer 15 in the post P. The conductivity is degraded in the oxidized region 13a, making the oxidized region 13a the current funneling region. At the same time, the optical refractive index thereof is approximately half (up to 1.6) the index of the neighboring semiconductor layers. Hence, the oxidized region 13a also serves as an optical confinement region. The nonoxidized region (conductive region) 13b serves as a current injection region.

Figure 5B:
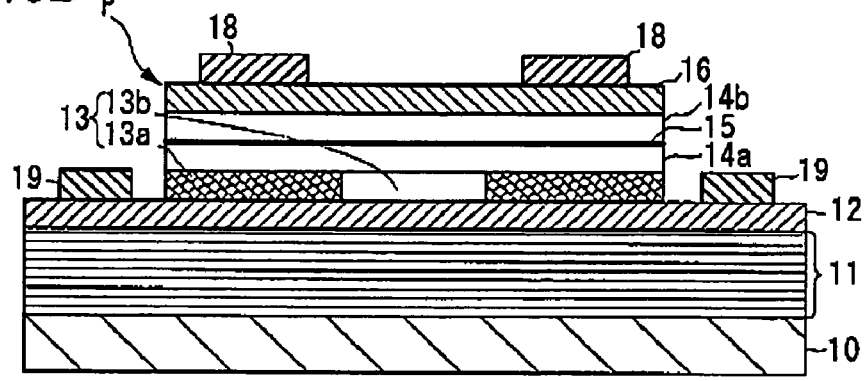

Then, referring to FIG. 5B, the ring-shaped contact electrodes 18 and 19 of two-layered structure having titanium and gold (Ti/Au) are respectively formed on the top of the post to establish electric contact with the first contact layer 16 and on the bottom of the post to establish electric contact with the second contact layer 12. The first electrode 18 has a ring shape in which an opening is arranged in the center having an inner diameter of 20 μm so as to emit the laser beams from the top surface of the post. Further, extensional wires, not shown, may be provided on the contact electrodes 18 and 19 to facilitate the mounting a VCSEL element on a stem or the like.

Figure 5C:
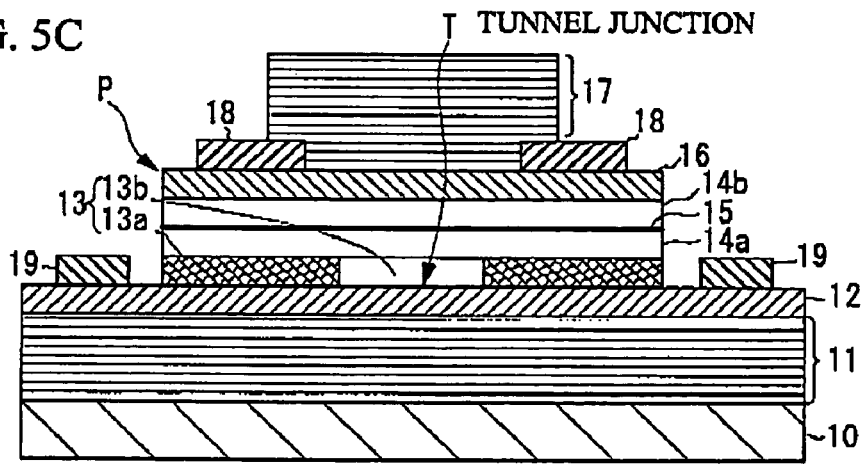

Subsequently, as shown in FIG. 5C, a laminated body of the dielectric multiple films having multiple layers of $TiO_2$ and $SiO_2$ is deposited on the top of the post. Then, the opening arranged in the center of the ring-shaped first electrode 18 is partially covered and processed by the lift-off method, and the top reflective film 17 is formed to obtain the VCSEL 1 in accordance with the first embodiment of the present invention as shown in FIG. 1.

In the present embodiment of the present invention, the highly doped layer 13, which is a laminated body of the $p^{++}$ $Al_{0.48}In_{0.52}As$ and the p-type AlAs/InAs of the short-period supper-lattice layer, is sandwiched between the first contact layer 16 of n-type InP layer and the second contact layer 12 of $n^{++}$ InPlayer. The tunnel junction T is formed in the interface of the highly doped layer 13 and the second contact layer 12. Voltages applied to the first contact layer 16 positively charged and the second contact layer 12 negatively charged, the tunneling current, which varies depending on the voltage values applied, flows across the first and second contact layers 16 and 12.

Here, the highly doped layer 13, forming one side of the tunnel junction T, is partially made up with the short-period supper-lattice layer later. The highly doped layer 13 also includes the oxidized region 13a, in which the AlAs layer is oxidized from the periphery in the thermal treatment and forms a high resistant region. This confines the tunneling current. In addition, the oxidized region 13a is degraded in the refractive index, producing the light confinement effect to the light emitting region. In this manner, a combination of the tunnel junction and the selective oxidation makes it possible to obtain the VCSEL element with low threshold currents, high efficiency, and excellent response characteristics, with high repeatability and stability.

Next, a description will be given of the fabrication processes of the VCSEL 2 in accordance with the second embodiment of the present invention. Most fabrication processes are same as those of the VCSEL 1 in accordance with the first embodiment, so a description will be given of points of difference mainly. There are sequentially deposited on the substrate of n-type InP layer, the semiconductor multiple films 27 of a laminated body having multiple n-type InP layers and multiple n-type InGaAsP layers, the first contact layer 26 of $n^{++}$ InP layer, the highly doped layer 25 having the $p^{++}$ layer and the short-period super-lattice layer of AlAs/InAs, the spacer layer 23b of undoped InGaAsP layer, the active layer 24 of undoped InGaAsP layer, which is provided in a deposited direction, the spacer layer 23a of undoped InGaAsP layer, and the second contact layer 22 of n-type InP layer. Here, the carrier density of the $n^{++}$ InP layer is configured to be $3 \times 10^{19}$ $cm^{-3}$, and the carrier density of the short-period super-lattice layer of $p^{++}$ AlAs/InAs is also configured to be $3 \times 10^{19}$ $cm^{-3}$. Ten periods of AlAs/InAs are deposited in the short-period supper-lattice layer.

Subsequently, the semiconductor multiple films 21 of a laminated body having multiple films of undoped GaAs layers and undoped $Al_{0.48}In_{0.52}As$ layers are deposited on the undoped GaAs substrate 20. Each of the layers forming the semiconductor multiple films 21 and 27 is configured to be λ/4nr, and two types of layers having different compositions are alternately deposited.

Then, as in the first embodiment of the present invention, two substrates are bonded together so that the second contact layer 22 faces the semiconductor multiple films 21, and the fusion bonding is thermally implemented on the substrates. The subsequent etch and oxidation processes are same as in the first embodiment.

Next, the ring-shaped contact electrodes 28 and 29 of two-layered structure having titanium and gold (Ti/Au) are respectively formed on the top of the post to establish electric contact with the semiconductor multiple films 27 and on the bottom of the post to establish electric contact with the second contact layer 22.

On the present embodiment as described above, the highly doped layer 25 of the short-period super-lattice layer having $p^{++}$ AlAs/InAs is interposed between the first contact layer 26 of n-type InP layer and the second contact layer 22 of $n^{++}$ InP layer. The interface of the first contact layer 26 and the highly doped layer 25 forms the tunnel junction T. When the voltages are applied to the semiconductor multiple films 27 positively charged and provided on the first contact layer 26 and the second contact layer 22 negatively charged, the tunneling current varying depending on such applied voltage values flows across the semiconductor multiple films 27 and the second contact layer 22.

Here, the highly doped layer 25, forming one side of the tunnel junction T, is partially made up with the short-period supper-lattice later. The highly doped layer 25 also includes the oxidized region 25a, in which the AlAs layer is oxidized from the periphery in the thermal treatment and forms a high resistant region. This confines the tunneling current. In addition, the oxidized region 25a is degraded in the refractive index, producing the light confinement effect to the light emitting region. In this manner, a combination of the tunnel junction and the selective oxidation makes it possible to obtain the VCSEL element with low threshold currents, high efficiency, and excellent response characteristics, with high repeatability and stability.

In the first embodiment, the column-shaped post P is formed, and then, the oxidation and electrode formation processes are completed. However, the shape of the post P is not related to a true nature of the present invention. Therefore, a shape of square column may be employed and an arbitrary shape is applicable within the scope of the principle of operation of the present invention.

In the second embodiment, a combination of $TiO_2/SiO_2$ is employed for the material that forms the dielectric multiple films. However, the present invention is not limited to the aforementioned materials, for example, ZnO, MgO, $Al_2O_3$, or the like is applicable. Also, silicon may be employed.

Furthermore, the VCSELs in accordance with the first and second embodiments of the present invention exemplify InGaAsP-based compound semiconductor lasers. In addition, the semiconductor laser that includes a gallium nitride-based material or indium gallium arsenide-based material is applicable. In accordance with the material, the oscillation wavelength may be changed as necessary.

The first embodiment of the present invention exemplifies that one of the top and bottom reflective films is composed of the semiconductor multiple films and the other is composed of dielectric multiple films. The second embodiment exemplifies that both of the top and bottom reflective films are composed of semiconductor multiple films. However, the present invention is not limited to the afore-mentioned examples. It is possible to form both of the reflective films with the dielectric multiple films.

When the dielectric multiple films are used for the reflective film, such reflective film cannot be configured to be the electric path, yet in the second embodiment, the top reflective film is composed of the semiconductor multiple films to exemplify the top reflective film serving as the electric path. When the bottom reflective film is also composed of the semiconductor multiple films, it is possible to make both the top and bottom reflective films function as the electric paths. However, if the InGaAsP-based active layer is employed, it will be difficult to obtain high reflectance with the material lattice matched to the InP substrate, as described above. Therefore, even if the top and bottom reflective films are made of the semiconductor multiple films, both the top and bottom reflective films do not have to serve as the electric paths.

Alternatively, when the semiconductor multiple films other than the lattice matched material are bonded in the substrate fusion method, it is not easy to let the carriers pass through the interface effectively, yet in principle, it is not impossible to design the interface to serve as the electric path.

Figure 6A:
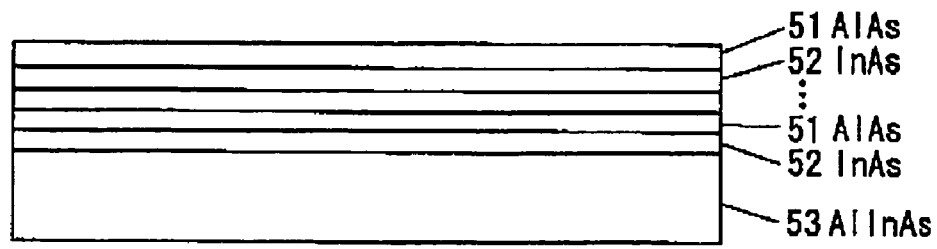
FIGS. 6A and 6B are cross-sectional view a highly doped layer of the VCSEL in accordance with the first embodiment of the present invention.
Figure 6B:
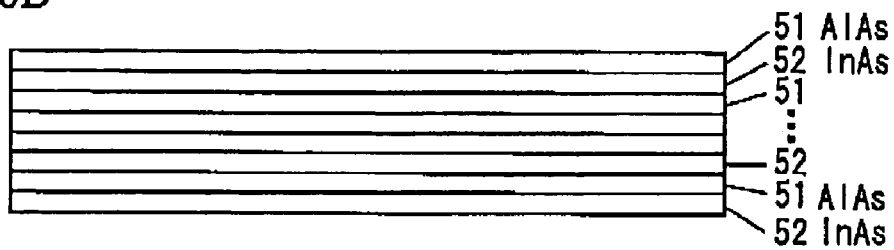

In the present invention, the highly doped layer is a key component of the tunnel junction T and the selective oxidation. In accordance with the first embodiment, referring now to FIG. 6A, the highly doped layer includes a $p^{++}$ type $Al_{0.48}In_{0.52}As$ layer 53 and a laminated body having p-type AlAs short-period super-lattice layers 51 and InAs short-period super-lattice layers 52. In accordance with the second embodiment, referring to FIG. 6B, the highly doped layer includes the p-type AlAs short-period super-lattice layers 51 and the InAs short-period super-lattice layers 52. In accordance with the first embodiment, the highly doped layer 13 includes the p-type AlAs/InAs short-period supper-lattice layers (51 and 52) and the layer 53 of $p^{++}$ type $Al_{0.48}In_{0.52}As$, which are sequentially deposited, yet the highly doped layer 13 is not limited to afore-mentioned example, the layer 53 of p$^{++}$ type $Al_{0.48}In_{0.52}As$ and the p-type AlAs/InAs short-period supper-lattice layers 51 and 52 may be sequentially deposited.

It is a point that the short-period super-lattice layer having the AlAs layers is inserted into at least a part of the highly doped layer. This does not form a combination or pair with the top reflective film of the dielectric multiple films or semiconductor multiple films. Other materials may be changed as necessary.

The tunnel junction T is arranged in the interface of the second contact layer 12 and the highly doped layer 13 in accordance with the first embodiment, and is arranged in the interface of the first contact layer 26 and the highly doped layer 25 in accordance with the second embodiment. In accordance with the first embodiment, the short-period super-lattice layer is deposited after the active regions 14a, 14b, and 15 are deposited. In accordance with the second embodiment, the short-period super-lattice layer is deposited before the active regions 23a, 23b, and 24 are deposited. There is a difference. As described above, such difference may cause a difference in the crystal performance, and the former process is more desirable. However, there is no difference other than the crystal performance in principle of operation. Either process may be employed.

Lastly, although a few embodiments of the present invention have been shown and described, it would be appreciated by those skilled in the art that changes may be made in these embodiments without departing from the principles and spirit of the invention, the scope of which is defined in the claims and their equivalents.

Next, a description will be given of an example the VCSEL in accordance with the present invention is applied as a light source. The VCSEL can be used as the light source in a single laser device, yet multiple laser devices mounted on the substrate can be used as a parallel light source.

Figure 7:
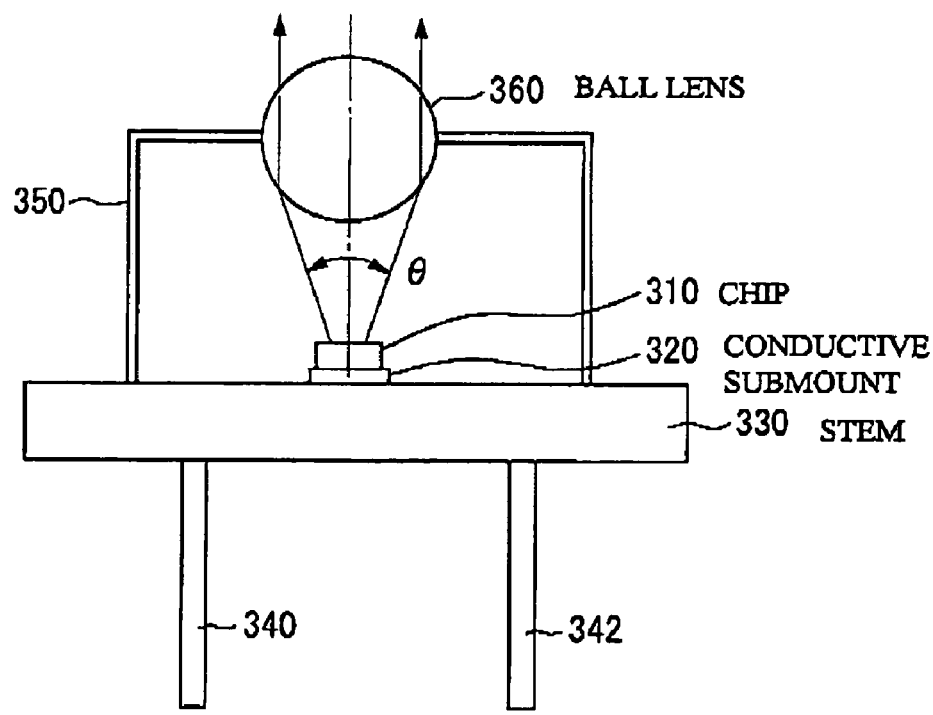
FIG. 7 is a cross-sectional view of a VCSEL chip, which is incorporated into a package (optical module)

FIG. 7 is a cross-sectional view of a VCSEL chip, which is incorporated into a package (optical module). Referring to FIG. 7, a package 300 includes a chip 310 having the VCSEL. The chip 310 is secured onto a disc-shaped metal stem 330 with a conductive submount 320. Conductive leads 340 and 342 are inserted into through-bores, not shown, provided in the stem 330. The lead 340 is electrically coupled to the first electrode formed on the backside of the chip 310, and the lead 342 is electrically coupled to the second electrode formed on the surface of the chip 310 with a bonding wire or the like.

A rectangle-shaped hollow cap 350 is secured onto the step 330 having the chip 310 thereon, and a ball lens 360 is secured in an opening arranged in the center of the cap 350. A light axis of the ball lens 360 is positioned to approximately correspond to the center of the chip 310. A forward voltage is applied to the leads 340 and 342, and then the laser beams are emitted from the mesa of the chip 310. The distance between the chip 310 and the ball lens 360 is adjusted so that the ball lens 360 may be included within an emitting angle θ of the laser beams emitted from the chip 310. A light receiving element may be included in the cap 350 so as to monitor an emitting state of the VCSEL.

Figure 8:
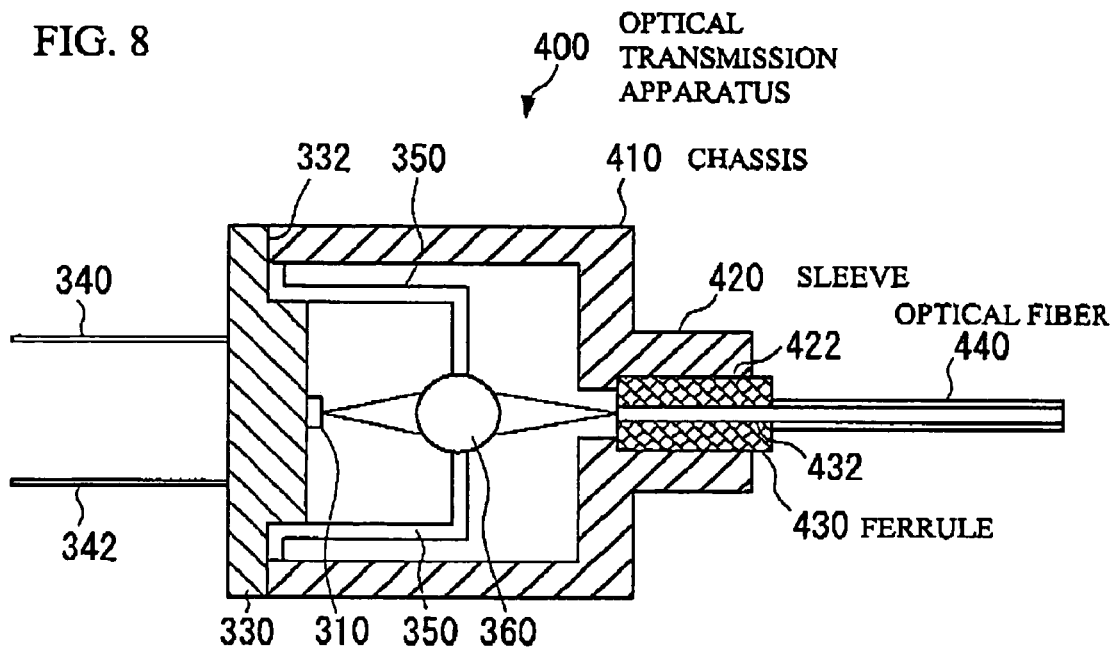
FIG. 8 is a cross-sectional view of an optical transmission apparatus to which the package or module shown in FIG. 7 is applied.

FIG. 8 is a cross-sectional view of an optical transmission apparatus to which the package or module shown in FIG. 7 is applied. An optical transmission apparatus 400 includes a chassis 410, a sleeve 420, a ferrule 430, and an optical fiber 440. The chassis 410 is cylinder-shaped, and secured to the stem 330. The sleeve 420 is formed together with the chassis 410 on edges of the chassis 410 as one member. The ferrule 430 is retained inside an opening 422 of the sleeve 420. The optical fiber 440 is retained by the ferrule 430.

An edge of the chassis 410 is secured to a flange 332 formed in a circumference direction of the stem 330. The ferrule 430 is accurately positioned in the opening 422 of the sleeve 420, and the light axis of the optical fiber 440 is aligned with the light axis of the ball lens 360, A cable core of the optical fiber 440 is retained in a through-bore 432 of the ferrule 430.

The laser beams emitted from the surface of the chip 310 are focused by the ball lens 360. Such focused beams are entered into the cable core of the optical fiber 440, and are then transmitted. In the above-mentioned example, the ball lens 360 is employed, yet other than that, another type of lens such as a biconvex lens, plane-convex lens, or the like maybe employed. In addition, the optical transmission apparatus 400 may include a drive circuit to apply electric signals to the leads 340 and 342. The optical transmission apparatus 400 may include a receiving device to receive optical signals via the optical fiber 440.

Figure 9:
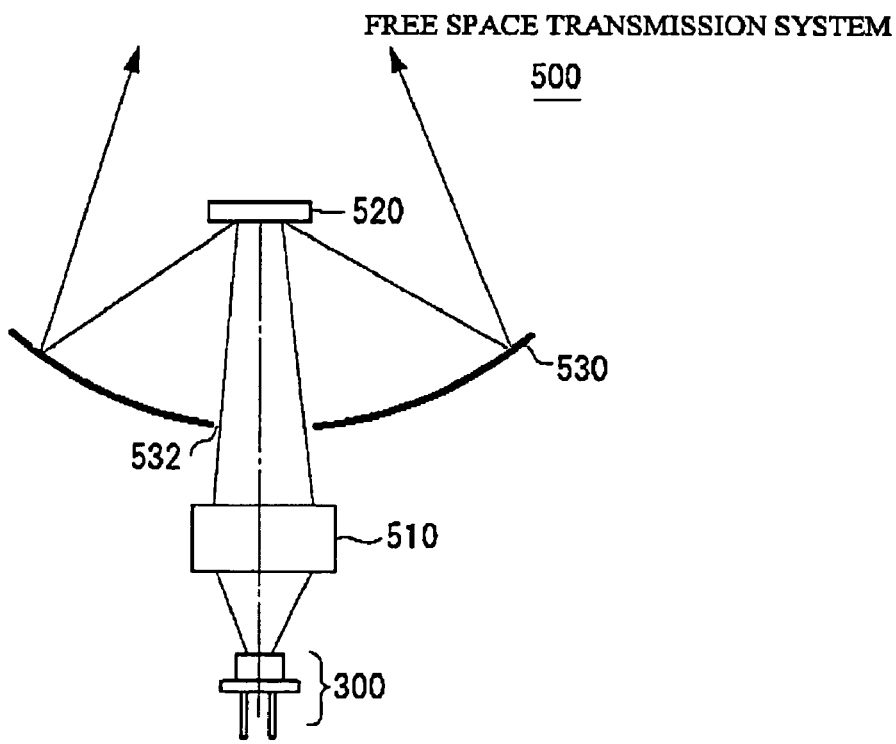
FIG. 9 is a view illustrating a configuration of a space transmission system to which the package or module shown in FIG. 7 is applied.

FIG. 9 is a view illustrating a configuration of a space transmission system to which the package or module shown in FIG. 7 is applied. A space transmission system 500 includes the package 300, a collective lens 510, a diffuser 520, and a reflection mirror 530. The space transmission system 500 utilizes the collective lens 510, instead of the ball lens 360 used in the package 300. The lights collected by the collective lens 510 are reflected by the diffuser 520 via an opening 532 provided in the reflection mirror 530. Such reflected lights are emitted toward the reflection mirror 530. Such reflected lights are then reflected by the reflection mirror 530 toward given directions, for optical transmission. A multi-spot VCSEL may be employed as the light source in the space transmission for high outputs.

Figure 10:
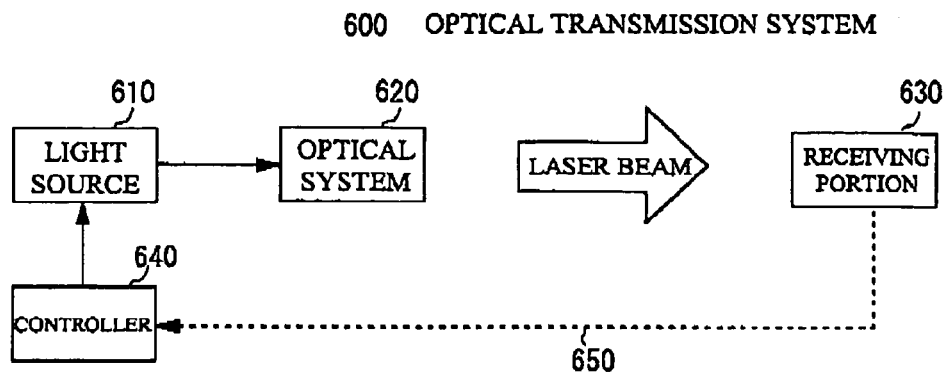
FIG. 10 is a view illustrating a configuration of the optical transmission system to which VCSEL is used as the light source.

FIG. 10 is a view illustrating a configuration of the optical transmission system to which VCSEL is used as the light source. An optical transmission system 600 includes a light source 610, an optical system 620, a receiving portion 630, and a controller 640. The light source 610 includes the chip 310 having the VCSEL. The optical system 620 collects the laser beams emitted from the light source 610. The receiving portion 630 receives the laser beams emitted from the optical system 620. The controller 640 controls to drive the light source 610. The controller 640 supplies driving pulse signals to the light source 610 so as to drive the VCSEL. The light emitted from the light source 610 passes through the optical system 620, and is transmitted to the receiving portion 630 via the optical fiber, the reflection mirror used for the space transmission, and the like. The receiving portion 630 detects the light received with a photodetector or the like. The receiving portion 630 is capable of controlling the operation of the controller 640, for example, a timing to start the optical transmission, with a control signal 650.

Figure 11:
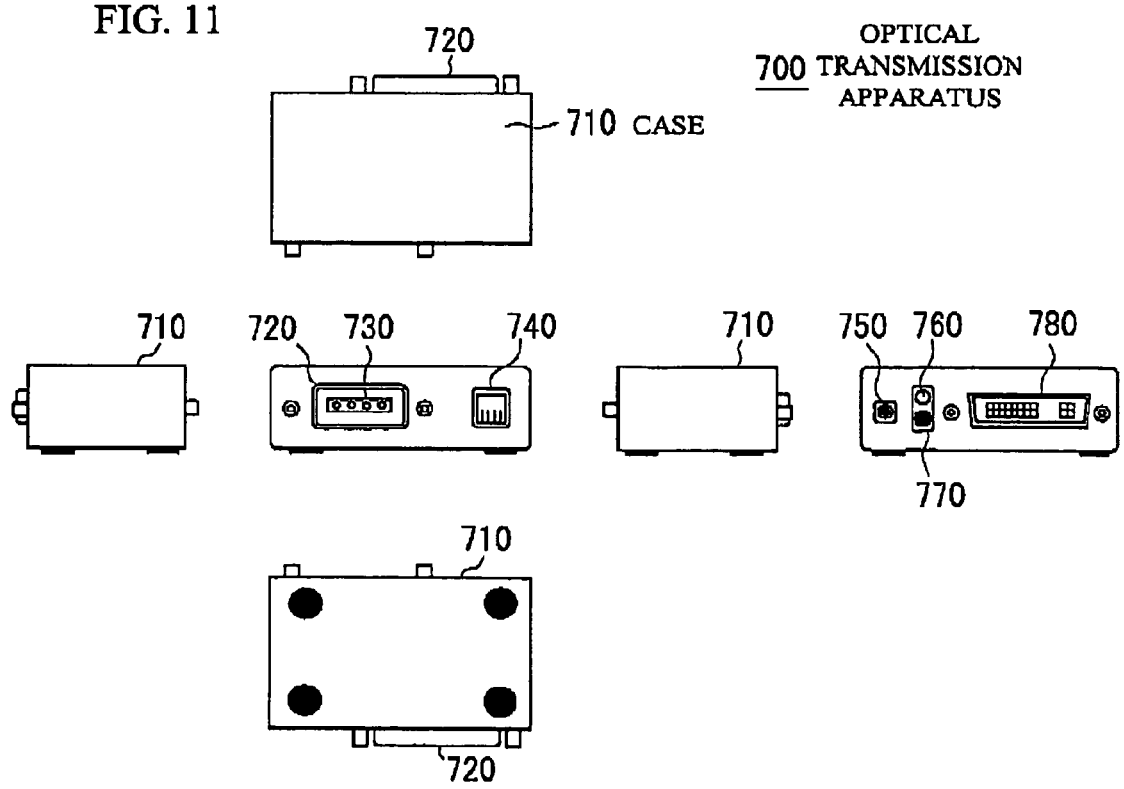
FIG. 11 is a view illustrating an appearance of the optical transmission apparatus.
Figure 12A:
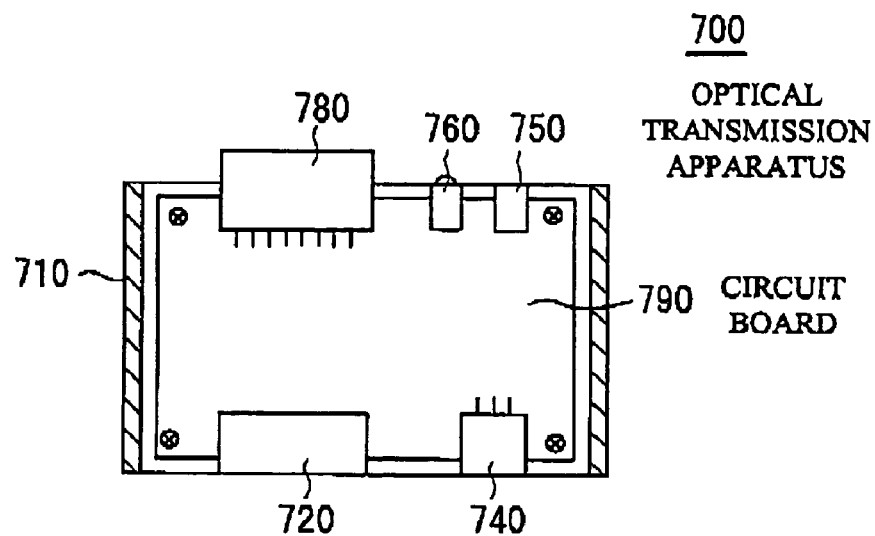
FIGS. 12A and 12B schematically show internal configurations of the optical transmission apparatuses; and is
Figure 12B:
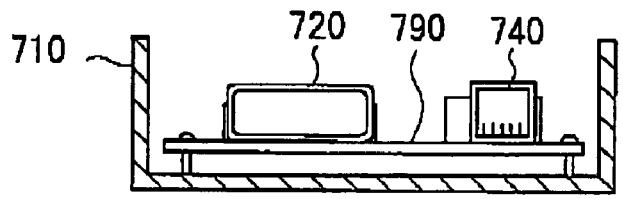

Next, a description will be given of the configuration of the optical transmission apparatus used for the optical transmission system. FIG. 11 is a view illustrating an appearance of the optical transmission apparatus. FIGS. 12A and 12B schematically show internal configurations. An optical transmission apparatus 700 includes a case 710, an optical signal transmitting/receiving connector connection portion 720, a light emitting/receiving element 730, an electric signal cable connection portion 740, a power source input portion 750, an LED 760 that indicates active, another LED 770 that indicates abnormal, a DVI connector 780, and a transmitting circuit board/receiving circuit board 790.

Figure 13:
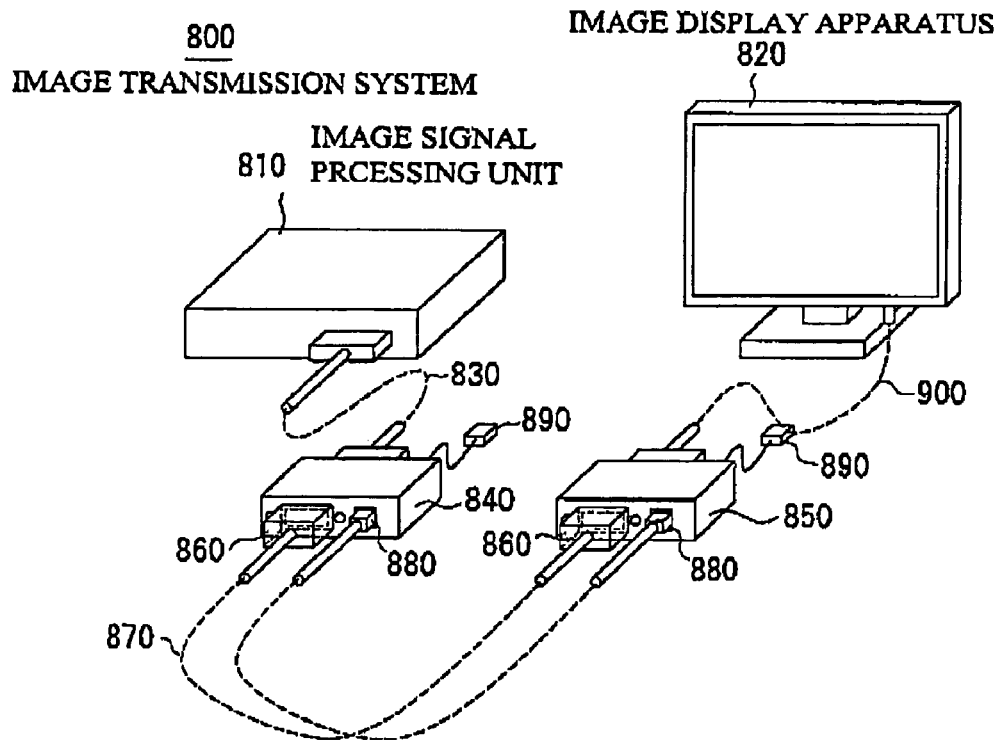
FIGS. 13 and 14 show image transmission systems with the use of the optical transmission apparatus.
Figure 14:
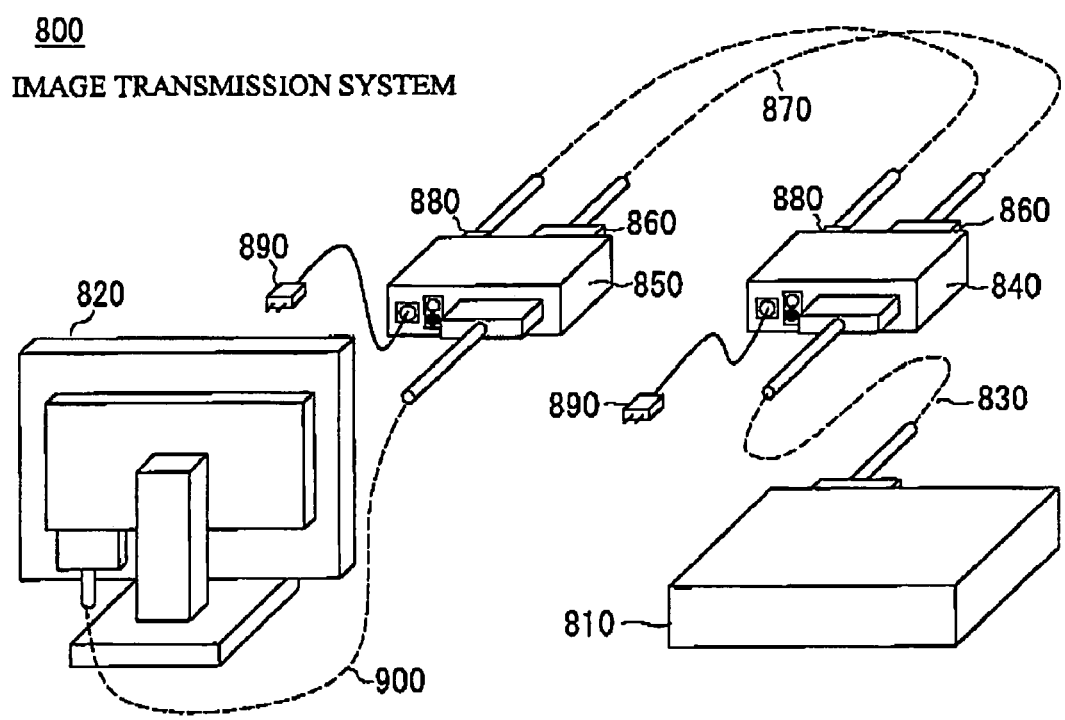

FIGS. 13 and 14 show image transmission systems with the use of the optical transmission apparatus 700. In these drawings, an image transmission system 800 utilizes the optical transmission apparatus shown in FIG. 8 so as to transmit image signals generated by an image signal processing unit 810 to an image display apparatus 820 such as a crystal liquid display. That is to say, the image transmission system 800 includes the image signal processing unit 810, the image display apparatus 820, an electric cable for DVI 830, a transmitting module 840, a receiving module 850, a connector for image signal transmitting optical signal 860, an optical fiber 870, an electric cable connector for image signal transmission 880, a power adaptor 890, and an electric cable for DVI 900.

In the afore-mentioned image transmission system, the image signal processing unit 810 and the transmitting module 840 are connected with the electric cable 830, and the receiving module 850 and the image display apparatus 820 are connected with the electric cable 900. However, the optical signals may transmit between the afore-mentioned components. For example, the electric cables 830 and 900 may be replaced by cables for signal transmission having connectors in which an electricity-light conversion device and a light-electricity conversion device are included.

It is therefore possible to arrange the surface emitting semiconductor laser diode of a tunnel junction type in accordance with the present invention on a semiconductor substrate solely or in a two-dimensional array for optical information processing and high-speed data transmission.

On the fabrication method of a surface emitting semiconductor laser diode of a tunnel junction type having a semiconductor substrate, a first reflector, a second reflector, an active region disposed in series between the first and second reflectors, and a tunnel junction region disposed in series between the first and second reflectors, the fabrication method including epitaxially growing the active region having a quantum well structure on the semiconductor substrate; and epitaxially growing the tunnel junction region having a supper-lattice layer. If the tunnel junction portion having the super-lattice layer is fabricated before the active region, the crystal performance is degraded in the active region. This is why the active region is fabricated before the tunnel junction region in order to maintain the crystal performance of the active region.

In accordance with the embodiments of the present invention, the first semiconductor layer (highly doped layer 13) includes the supper-lattice layer partially including aluminum, and the first semiconductor layer forms the tunnel junction region or tunnel junction portion. In this layer, a layer having a high relative proportion of aluminum is partially oxidized, and serves as a buried portion, namely, a current funneling region. This confines the tunneling current, and generates the laser oscillation at a low threshold current. In addition, the current funneling region can be formed without implementing a burying process with the use of epitaxial regrowth, which is easy to form an interface level. It is therefore possible to obtain excellent characteristics with repeatability.

When selecting the material lattice matched to the InP substrate and the oxidation rate is considered, there are not so many bulk semiconductor materials. However, the selection becomes wide by employing the short-period supper-lattices. This enables efficient current flow and light confinement.

In accordance with the embodiments of the present invention, the active region having a quantum well structure is fabricated before the tunnel junction region is fabricated by the epitaxial growth. Even if the strain stress is generated by mismatched lattice in the semiconductor film that forms the tunnel junction portion, the active region is not affected. If the epitaxial growth is performed in a wrong order, the strain stress due to the epitaxial growth in the tunnel junction affects the active region that includes the quantum well structure, which is fabricated subsequently. There may be a problem in the crystal performance or flatness of the laminated films.

In addition, it is possible to fabricate the multiple films that serves as the reflector on the InP substrate by the epitaxial growth in the InGaAsP-based VCSEL, yet it is difficult. Therefore, the semiconductor multiple films, which is not lattice matched, are separately formed. Then, it is possible to form the reflector of high reflectance by bonding the semiconductor multiple films in the substrate fusion bonding method or by depositing the dielectric multiple films.

Although a few embodiments of the present invention have been shown and described, it would be appreciated by those skilled in the art that changes may be made in these embodiments without departing from the principles and spirit of the invention, the scope of which is defined in the claims and their equivalents.

The entire disclosure of Japanese Patent Application No. 2005-112406 filed on Apr. 8, 2005 including specification, claims, drawings, and abstract is incorporated herein by reference in its entirety.

What is claimed is:

1. A surface emitting semiconductor laser diode of a tunnel junction type comprising:
   a semiconductor substrate;
   a first reflector;
   a second reflector;
   an active region disposed in series between the first and second reflectors; and
   a tunnel junction region disposed in series between the first and second reflectors,
   wherein the tunnel junction region includes a first semiconductor layer of a first conductive type and a second semiconductor layer of a second conductive type that forms a junction with the first semiconductor layer, the first semiconductor layer being composed of a supper-lattice layer that at least partially includes aluminum and is partially oxidized.

2. The surface emitting semiconductor laser diode of a tunnel junction type according to claim 1, wherein the supper-lattice layer having aluminum has a multi-film structure, in which at least a set of AlAs layer and InAs layer are alternately laminated.

3. The surface emitting semiconductor laser diode of a tunnel junction type according to claim 1, wherein the first semiconductor layer further includes a high impurity concentration layer in which impurities of the first conductive type are highly doped.

4. The surface emitting semiconductor laser diode of a tunnel junction type according to claim 3, wherein the high impurity concentration layer includes an AlInAs layer.

5. The surface emitting semiconductor laser diode of a tunnel junction type according to claim 1, wherein the active region has a quantum well structure that includes an active layer composed of at least In, Ga, As, and P.

6. The surface emitting semiconductor laser diode of a tunnel junction type according to claim 1, wherein:
   the first reflector includes either semiconductor multiple films or dielectric multiple films; and
   the second reflector includes either the semiconductor multiple films or the dielectric multiple films.

7. The surface emitting semiconductor laser diode of a tunnel junction type according to claim 6, wherein at least one of the first and second reflectors is composed of GaAs-based semiconductor multiple films.

8. The surface emitting semiconductor laser diode of a tunnel junction type according to claim 1, further comprising a post arranged on the substrate,
wherein the super-lattice layer having aluminum is formed in the post, and the super-lattice layer has an oxidation region that is selectively oxidized from an exposed side face thereof.

9. The surface emitting semiconductor laser diode of a tunnel junction type according to claim 8, further comprising:
a first electrode provided on a top of the post; and
a second electrode provided on a bottom of the post,
wherein voltages applied onto the first and second electrodes generate a tunneling current in the tunnel junction region.

10. A module having a surface emitting semiconductor laser diode of a tunnel junction type comprising:
a semiconductor substrate;
a first reflector;
a second reflector;
an active region disposed in series between the first and second reflectors; and
a tunnel junction region disposed in series between the first and second reflectors,
wherein the tunnel junction region includes a first semiconductor layer of a first conductive type and a second semiconductor layer of a second conductive type that forms a junction with the first semiconductor layer, the first semiconductor layer being composed of a supper-lattice layer that at least partially includes aluminum and is partially oxidized.

11. An optical transmission apparatus comprising:
a module; and
a transmission device that transmits a laser beam emitted from the module,
the module having a surface emitting semiconductor laser diode of a tunnel junction type that includes a semiconductor substrate, a first reflector, a second reflector, an active region disposed in series between the first and second reflectors, and a tunnel junction region disposed in series between the first and second reflectors,
wherein the tunnel junction region includes a first semiconductor layer of a first conductive type and a second semiconductor layer of a second conductive type that forms a junction with the first semiconductor layer, the first semiconductor layer being composed of a supper-lattice layer that at least partially includes aluminum and is partially oxidized.

12. A free space optical transmission apparatus comprising:
a module; and
a transmission device that transmits spatially a laser beam emitted from the module,
the module having a surface emitting semiconductor laser diode of a tunnel junction type that includes a semiconductor substrate, a first reflector, a second reflector, an active region disposed in series between the first and second reflectors, and a tunnel junction region disposed in series between the first and second reflectors,
wherein the tunnel junction region includes a first semiconductor layer of a first conductive type and a second semiconductor layer of a second conductive type that forms a junction with the first semiconductor layer, the first semiconductor layer being composed of a supper-lattice layer that at least partially includes aluminum and is partially oxidized.

13. An optical transmission system comprising:
a module; and
a transmission device that transmits a laser beam emitted from the module,
the module having a surface emitting semiconductor laser diode of a tunnel junction type that includes a semiconductor substrate, a first reflector, a second reflector, an active region disposed in series between the first and second reflectors, and a tunnel junction region disposed in series between the first and second reflectors,
wherein the tunnel junction region includes a first semiconductor layer of a first conductive type and a second semiconductor layer of a second conductive type that forms a junction with the first semiconductor layer, the first semiconductor layer being composed of a supper-lattice layer that at least partially includes aluminum and is partially oxidized.

14. A free space optical transmission system comprising:
a module; and
a transmission device that transmits spatially a laser beam emitted from the module,
the module having a surface emitting semiconductor laser diode of a tunnel junction type that includes a semiconductor substrate, a first reflector, a second reflector, an active region disposed in series between the first and second reflectors, and a tunnel junction region disposed in series between the first and second reflectors,
wherein the tunnel junction region includes a first semiconductor layer of a first conductive type and a second semiconductor layer of a second conductive type that forms a junction with the first semiconductor layer, the first semiconductor layer being composed of a supper-lattice layer that at least partially includes aluminum and is partially oxidized.

* * * * *